United States Patent [19]
Shiota et al.

[11] Patent Number: 5,889,703
[45] Date of Patent: Mar. 30, 1999

[54] DATA READ CIRCUIT

[75] Inventors: Kyoichi Shiota; Terunori Kubo, both of Tokyo, Japan

[73] Assignee: Mitsubishi Denki Kabushiki Kaisha, Tokyo, Japan

[21] Appl. No.: 116,257

[22] Filed: Jul. 16, 1998

[30]      Foreign Application Priority Data

Jan. 12, 1998  [JP]  Japan .................................. 10-003757

[51] Int. Cl.⁶ ........................... G11C 16/06; G11C 16/04
[52] U.S. Cl. .................................. 365/185.2; 365/185.21; 365/189.07; 365/189.09
[58] Field of Search ........................... 365/185.2, 185.21, 365/189.07, 189.09, 189.11, 207, 208

[56]              References Cited

U.S. PATENT DOCUMENTS

| | | | |
|---|---|---|---|
| 5,117,392 | 5/1992 | Harada | 365/185.21 |
| 5,291,452 | 3/1994 | Hotta | 365/207 |
| 5,659,503 | 8/1997 | Sudo et al. | 365/185.21 |
| 5,708,607 | 1/1998 | Lee et al. | 365/207 |

FOREIGN PATENT DOCUMENTS 9-69294   3/1997  Japan .
9-128983  5/1997  Japan .

*Primary Examiner*—David Nelms
*Assistant Examiner*—Trong Phan
*Attorney, Agent, or Firm*—Burns, Doane, Swecker & Mathis, LLP

[57]              ABSTRACT

Provided is a data read circuit that can execute data reading under a proper reference voltage in the event that element characteristics have been changed due to aged deterioration. When a sample memory cell (10a) is selected, a memory transistor (26a) in which no electrons are injected into its floating gate, enters ON state. At this time, a voltage ($V_{22}$) is inputted to an input terminal (22) of a sense amplification (18), and a control circuit (13) detects the voltage ($V_{22}$) to store it as a digital signal. On the other hand, when a sample memory cell (10b) is selected, a memory transistor (26b) in which electrons are injected into its floating gate, does not enter ON state. As a result, a voltage ($V_{11}$) is inputted as it is, to the input terminal (22). The control circuit (13) detects the voltage ($V_{11}$) to store it as a digital signal. Based on the two digital signals, the control circuit (13) sets a reference voltage ($V_{REF}$), and a reference voltage generating circuit (14) generates this reference voltage.

5 Claims, 5 Drawing Sheets

DATA READ CIRCUIT

BACKGROUND OF THE INVENTION

1. Field of the Invention

The present invention relates to data read circuits for reading data stored in memories of semiconductor integrated circuits, and more particularly, to a method of setting a reference voltage inputted to a sense amplifier.

2. Description of the Background Art

FIG. 5 is a schematic diagram showing the configuration of a general memory. An address bus 101 transmits the address data sent from an exterior (e.g., a CPU) to a memory 100. An address buffer 102 distributes the address data sent from the address bus 101, to a word decoder 104 and a bit decoder 105. A memory cell array 103 has a plurality of data memory cells (not shown) for storing data of "1" or "0", which are arranged in the form of a matrix. A word line 106 and a bit line 107 are connected to each data memory cell constituting the memory cell array 103. The word decoder 104 selects a desired word line designated by the address data, from a plurality of word lines 106. The bit decoder 105 selects a desired bit line designated by the address data, from a plurality of bit lines 107. A sense amplifier 108 detects and amplifies the data stored in a data memory cell that resides in the intersection of the word line 106 and the bit line 107 which have been selected by the word decoder 104 and the bit decoder 105, respectively. A data bus 109 transmits the data outputted from the sense amplifier 108 to the exterior of the memory 100 (e.g., a CPU).

FIG. 6 is a block diagram showing the configuration of a conventional data read circuit. That is, FIG. 6 shows a data read circuit per bit in the memory 100 of FIG. 5. A memory cell 110 corresponds to one of a plurality of data memory cells constituting the memory cell array 103 of FIG. 5. The memory cell 110 comprises a memory transistor 111 having a floating gate, and constitutes an EPROM (electrically programmable read only memory). A gate (G), a drain (D) and a source (S) of the memory transistor 111 are connected to a word line 106a, a bit line 107a and a ground, respectively. Here, the word line 106a and the bit line 107a correspond to one of a plurality of word lines 106 and bit lines 107 in FIG. 5, respectively. The bit line 107a is connected to a selector 105a. The selector 105a corresponds to part of the bit decoder 105 in FIG. 5, and connects a wire 113 and the bit line 107a. A pull-up circuit 112 applies a specified voltage to the bit line 107a through the wire 113 and the selector 105a. A sense amplifier 108a has two input terminals 114, 115. To the input terminal 114, the voltage of the wire 113 is inputted through a node $ND_1$.

A reference voltage generating circuit 122 mainly comprises a memory transistor 116, a selector 119, and a pull-up circuit 121. Like the memory transistor 111, the memory transistor 116 comprises an EPROM cell having a floating gate. The source, drain, and gate of the memory transistor 116 are connected to a ground, a wire 118, and a wire 117, respectively. The wire 118 is connected to the selector 119, which is connected to a pull-up circuit 121 through a wire 120 having a node $ND_2$. To the input terminal 115 of the sense amplifier 108a, the voltage of the wire 120 is inputted as a reference voltage $V_{REF}$, through the node $ND_2$.

Hereafter, the operation of reading data stored in a memory cell 110 will be described. Firstly, a word line 106a applies a voltage to the gate of a memory transistor 111. According to the storage content of the memory cell 110, the memory transistor 111 enters ON or OFF state, so that two types of, i.e., high and low, voltages $V_1$, $V_2$ are inputted to an input terminal 114 of a sense amplifier 108a.

To other input terminal 115 of the sense amplifier 108a, for example, an intermediate voltage of the voltages $V_1$, $V_2$ is inputted as a reference voltage $V_{REF}$. At this time, the pull-up circuit 121, the selector 119 and the memory transistor 116 are properly selected so as to set a desired value of the reference voltage $V_{REF}$.

The sense amplifier 108a compares a voltage $V_1$ or $V_2$ inputted to the input terminal 114 with a reference voltage $V_{REF}$ inputted to the input terminal 115, and amplifies its result and then outputs it.

In the conventional data read circuits so configured, however, in order to set a proper reference voltage $V_{REF}$, a reference voltage generating circuit 122 must be organized by complicated selections. That is, a pull-up circuit 121 for applying a desired voltage, and a memory transistor 116 and a selector 119 that cause a desired voltage drop, are selected depending on the characteristics of a memory transistor 111 and a pull-up circuit 112, and on the load of a selector 105a.

Meanwhile, even if a reference voltage generating circuit 122 can be organized by a proper selection of elements, aged deterioration may change the characteristics of the elements to alter a reference voltage $V_{REF}$. It is, however, impossible to reset a reference voltage $V_{REF}$, resulting in a short product-life cycle.

SUMMARY OF THE INVENTION

According to a first aspect of the present invention, a data read circuit that compares a reference voltage with a first voltage whose value fluctuates depending on as to whether a binary data stored in a data memory cell is one data or other data and based on a comparison result, reads the data stored in the data memory cell, comprises: at least one of a plurality of sample memory cells that stores the one and other data, respectively; comparison means that compares a first comparison voltage with a second voltage corresponding to the one data stored in at least one of the sample memory cells, and compares a second comparison voltage with a third voltage corresponding to the other data stored in at least one of the sample memory cells; and voltage generating means that generates the first and second comparison voltages, respectively, wherein the reference voltage is set based on a comparison result obtained by the comparison means.

According to a second aspect of the present invention, the data read circuit of the first aspect is characterized in that a comparison between the first voltage and the reference voltage is made by the comparison means.

According to a third aspect of the present invention, the data read circuit of the first aspect is characterized in that at least one of the sample memory cells is arranged in a memory cell array having a plurality of the data memory cells arranged in the form of a matrix.

According to a fourth aspect of the present invention, the data read circuit of the third aspect further comprises: a control section for controlling an operation of the data read circuit; and storage means connected to the control section. This data read circuit is characterized in that: at least one of the sample memory cells is arranged in at least two locations in the memory cell array; the storage means stores a first reference voltage obtained from at least one of the sample memory cells arranged in a first location, and stores a second reference voltage obtained from at least one of the sample memory cells arranged in a second location; and the control section sets the reference voltage based on the first and second reference voltages stored in the storage means.

According to a fifth aspect of the present invention, the data read circuit of the third aspect further comprises data write means that sequentially writes the one and other data in the sample memory cell.

In the data read circuit of the first aspect, a reference voltage is set based on second and third voltages that correspond to the data stored in a sample memory cell. This enables to omit a memory transistor for comparison that has been required in conventional data read circuit. It is therefore possible to avoid such a complicated work that a memory transistor for comparison having a proper characteristics is selected according to the characteristics of a memory transistor constituting a data memory cell.

In the data read circuit of the second aspect, the comparison means that compares a first voltage with a reference voltage shares the same circuit with the comparison means that compares second and third voltages with the first and second comparison voltages, respectively. This produces the effect of the first aspect without making the circuit complicated.

In the data read circuit of the third aspect, the fluctuations in the characteristics of a sample memory cell becomes similar to that in a data memory cell by arranging the sample memory cell in a memory cell array, leading to a proper reference voltage setting.

In the data read circuit of the fourth aspect, it is possible to react to the fluctuations of characteristics in a plurality of locations in a memory cell array, leading to an improved reference voltage setting.

In the data read circuit of the fifth aspect, since one and other data can be sequentially written in a sample memory cell by data write means, a single sample memory is enough. This reduces the number of sample memory cells to be prepared, compared to the cases where a sample memory cell for one data and another sample memory cell for other data are provided separately.

Accordingly, it is an object of the present invention to provide data read circuits that permit an easy reset of a reference voltage in the event of the changes in element characteristics, to execute data reading under a proper reference voltage.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
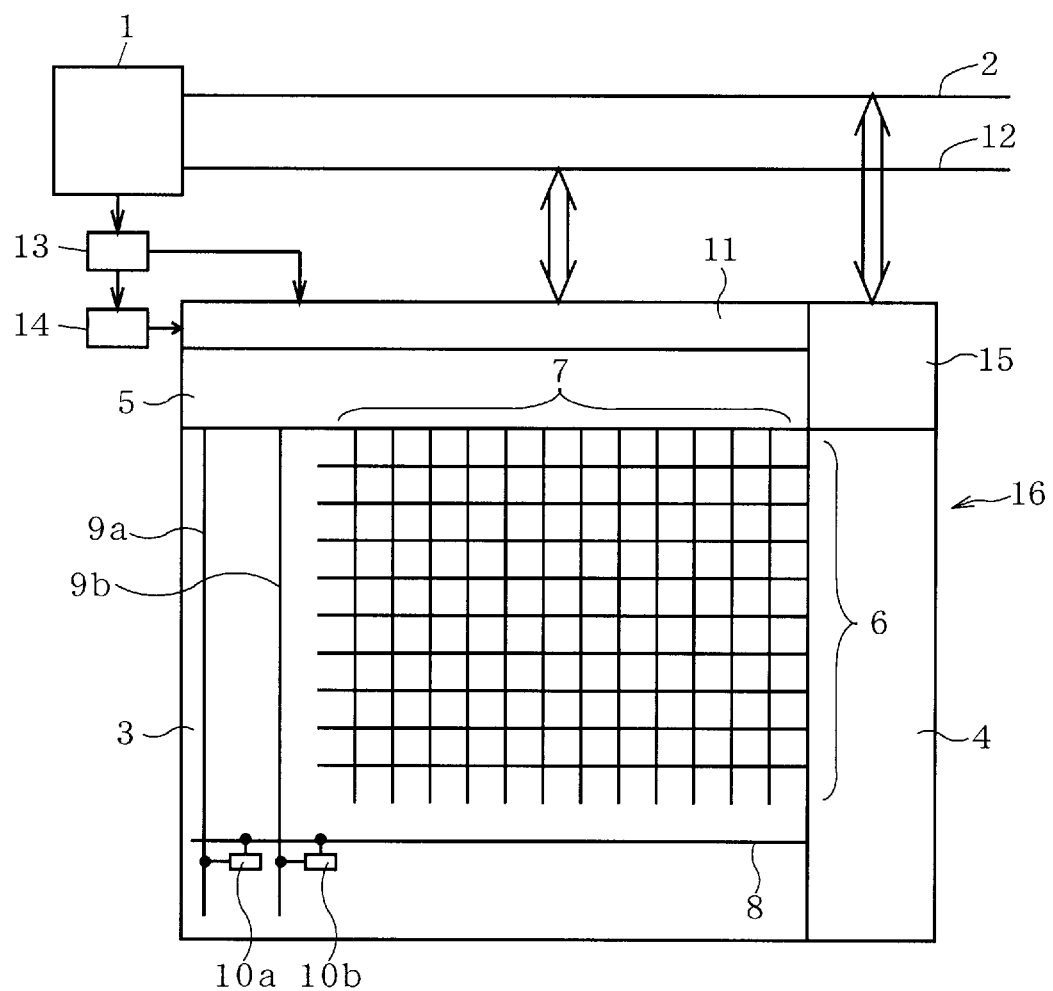
FIG. 1 is a schematic diagram showing an example of a memory configuration.

FIG. 1 is a schematic diagram showing a memory configuration. Reference numeral 1 designates a CPU. An address bus 2 transmits the address data sent from the CPU 1 to a memory 16. An address buffer 15 distributes the address data sent from the address bus 2 to a word decoder 4 and a bit decoder 5. A memory cell array 3 has a plurality of data memory cells (not shown) for storing data of "1" or "0", which are arranged in the form of a matrix. The data memory cells constituting the memory cell array 3 are composed of, for example, an EPROM cell that is a memory transistor having a floating gate. A word line 6 and a bit line 7 are connected to each of the data memory cells. The memory cell array 3 also has a sample memory cell 10a for storing data "1", and a sample memory cell 10b for storing data "0". The sample memory cell 10a is connected to a word line 8 and a bit line 9a. The sample memory cell 10b is connected to the word line 8 and a bit line 9b. A word decoder 4 selects a desired word line that has been designated by the address data, from a plurality of word lines 6, 8. A bit decoder 5 selects a desired bit line that has been designated by the address data, from a plurality of bit lines 7, 9a, 9b. A sense amplification section 11 detects and amplifies the data stored in the memory cell that resides in the intersection of the word line and bit line which have been selected by the word decoder 4 and bit decoder 5, respectively. A data bus 12 transmits the data outputted from the sense amplification section 11, to the CPU 1. Reference numerals 13 and 14 designate a control circuit and a reference voltage generating circuit, respectively. They will be described later in detail.

Figure 2:
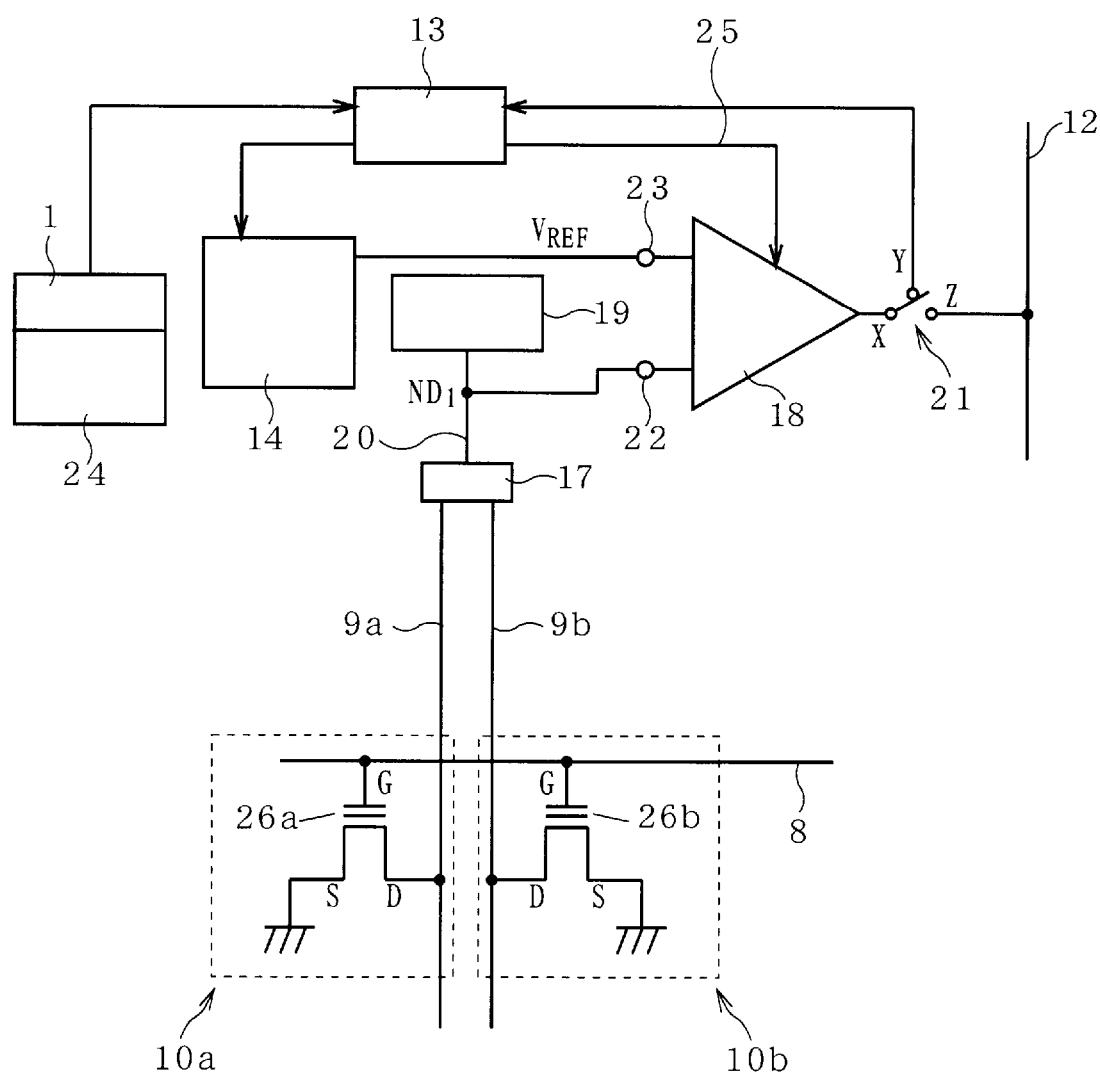
FIG. 2 is a block diagram showing the configuration of a data read circuit according to a preferred embodiment of the present invention.

FIG. 2 is a block diagram showing the configuration of a data read circuit according a preferred embodiment of the present invention. Sample memory cells 10a and 10b comprise memory transistors 26a and 26b, respectively. The memory transistors 26a, 26b constitute an EPROM. No electrons are injected to the floating gate of the memory transistor 26a, so that the memory transistor 26a has a low operating threshold voltage. On the other hand, electrons are injected to the floating gate of the memory transistor 26b, so that the memory transistor 2b has a high operating threshold voltage. The gate (G), drain (D) and source (S) of the memory transistor 26a are connected to the word line 8, the bit line 9a and a ground, respectively. The gate (G), drain (D) and source (S) of the memory transistor 26b are connected to the word line 8, the bit line 9b and a ground, respectively.

The bit lines 9a, 9b are connected to a selector 17. The selector 17 corresponds to part of the bit decoder 5 shown in FIG. 1, and selects the bit line 9a or 9b, to connect it to a wire 20. When the data stored in a data memory cell is read, the bit decoder 5 causes a voltage drop. By interposing the selector 17 between a sense amplification 18 and the sample memory cells 10a, 10b, the selector 17 can cause a voltage drop similar to that by the bit decoder 5. A pull-up circuit 19 applies a specified voltage to the wire 20. This voltage is also applied to the bit lines 9a, 9b, through the selector 17.

The sense amplification 18 (comparison means) has two input terminals 22, 23. To the input terminal 22, the voltage of the wire 20 is inputted through a node $ND_1$. The sense amplification 18 corresponds to part of the sense amplification section 11 shown in FIG. 1, and its operation is controlled by a control signal that is inputted from a control circuit 13 through a control signal line 25. A reference voltage generating circuit (voltage generating means) 14 generates specified comparison voltages $V_{00}$, $V_{01}$, and a specified reference voltage $V_{REF}$, based on a control signal from the control circuit 13. The reference voltage generating circuit 14 is composed of, for example, a DA converter that converts a digital signal to an analog signal. A switch 21 selects a terminal Y or Z, to connect it to a terminal X. When the terminal Y is selected, the sense amplification 18 is connected to the control circuit 13. When the terminal Z is selected, the sense amplification 18 is connected to the data bus 12. A memory 24 is connected to a CPU 1, and stores a program based on which the CPU 1 performs the setting of a reference voltage $V_{REF}$.

Referring to FIG. 1, the operation of the circuit shown in FIG. 2 will be described. It is noted that the following operation is executed by a CPU 1 based on a program stored in a memory 24

Firstly, a reference voltage $V_{REF}$ is set. At this time, a switch 21 connects terminals X and Y. After the power supply of a device is turned on, a bit decoder 5 (a selector 17) selects a bit line 9a, and a word decoder 4 selects a word line 8, so that a sample memory cell 10a is selected. Since no electrons are injected to the floating gate of a memory transistor 26a constituting the sample memory cell 10a, its operating threshold voltage is low. Accordingly, when a gate voltage is applied by the word line 8, the memory transistor 26a is in ON state. At this time, a voltage $V_{11}$, is applied to a wire 20 by a pull-up circuit 19, and this voltage $V_{11}$, is also applied to the bit line 9a through the selector 17. As a result, when the memory transistor 26a enters ON state, the current flows to the bit line 9a and a voltage drop is caused by the selector 17 and the memory transistor 26a, so that a voltage $V_{22}$ is inputted to one input terminal 22 of a sense amplification To detect the voltage $V_{22}$, a reference voltage generating circuit 14 inputs a comparison voltage $V_{00}$ to other input terminal 23 of the sense amplification 18. The value of voltage $V_{22}$ can be expected to some extent at the design stage. Hence, as a comparison voltage $V_{0t}$, there is firstly inputted a low voltage that has a specified margin to an expected voltage $V_{22}$, and the value of the comparison voltage $V_{00}$ is then gradually increased. Since the sense amplification 18 has the function of comparing the voltages inputted to the two input terminals 22, 23, it is possible to detect the voltage $V_{22}$, as a voltage obtained when the result of a comparison between the comparison voltage $V_{00}$ and the voltage $V_{22}$ made by the sense amplification 18 is reversed in the course of increasing the value of the comparison voltage $V_{00}$. Then, a control circuit 13 stores the detected voltage $V_{22}$ as a digital value.

Next, the bit decoder 5 (the selector 17) selects a bit line 9b, and the word decoder 4 selects the word line 8, so that a sample memory cell 10b is selected. Since electrons are injected to the floating gate of a memory transistor 2b constituting the sample memory cell 10b, its operating threshold voltage is high. Accordingly, even if a gate voltage is applied by the word line 8, the memory transistor 26b does not enter ON state. At this time, a voltage $V_{11}$ is applied to the wire 20 by the pull-up circuit 19, and this voltage $V_{11}$ is also applied to the bit line 9b through the selector 17. However, since the memory transistor 26b is not in ON state, no currents flow to the bit line 9b, so that the voltage $V_{11}$ is inputted as it is, to the input terminal 22 of the sense amplification 18.

To detect the voltage $V_{11}$, the reference voltage generating circuit 14 inputs a comparison voltage $V_{01}$, to the input terminal 23 of the sense amplification 18. The value of the voltage $V_{11}$ can be expected to some extent at the design stage. Hence, as a comparison voltage $V_{01}$, there is firstly inputted a low voltage that has a specified margin to an expected voltage $V_{11}$, and the value of the comparison voltage $V_{01}$ is then gradually increased. Thus, it is possible to detect the voltage $V_{11}$, as a voltage obtained when the result of a comparison between the comparison voltage $V_{01}$ and the voltage $V_{11}$ made by the sense amplification 18 is reversed in the course of increasing the value of the comparison voltage $V_{01}$. Then, the control circuit 13 stores the detected voltage $V_{11}$ as a digital value.

Based on the stored two digital values, the control circuit 13 performs an arithmetic operation to obtain, for example, an intermediate digital value of both, and then outputs it, as a digital signal, to the reference voltage generating circuit 14. Based on this digital signal, the reference voltage generating circuit 14 generates a reference voltage $V_{REF}$. In this case, an intermediate voltage between the voltages $V_{11}$, and $V_{22}$, i.e., $(V_{11}+V_{22})$ 2, is generated as the reference voltage $V_{REF}$.

The reference voltage $V_{REF}$ generated by the reference voltage generating circuit 14 is inputted to the input terminal 23 of the sense amplification 18. Thereafter, the control circuit 13 drives a switch 21 to connect the terminals X and Z, and then enters the wait state in preparation for the normal data reading operation.

Figure 3:
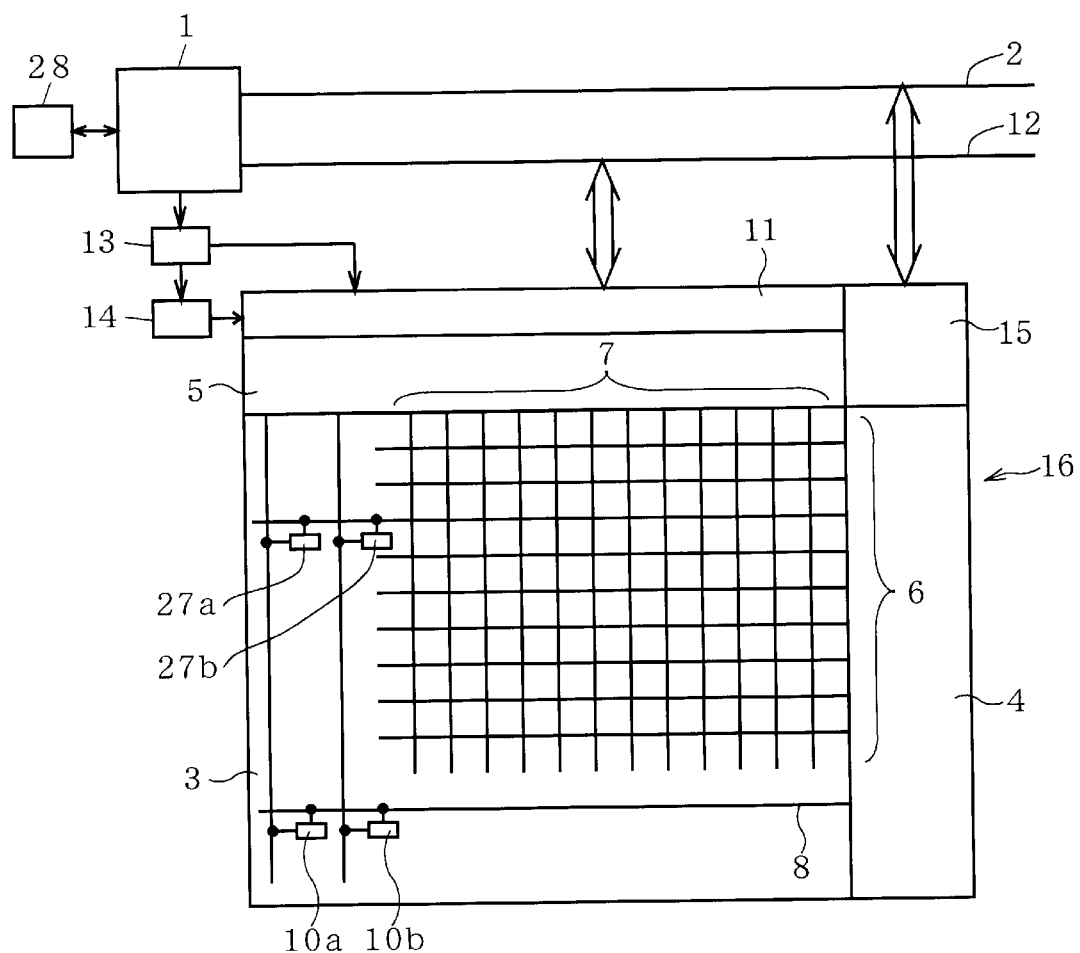
FIG. 3 is a schematic diagram showing another example of a memory configuration.

Although the foregoing description demonstrates the cases where the sample memory cells 10a, 10b are arranged in a single location in a memory cell array 3, sample memory cells may be arranged in a plurality of locations. FIG. 3 is a schematic diagram showing another configuration of a memory 16. That is, FIG. 3 shows the case where sample memory cells 10a, 10b, and 27a, 27b, are arranged in two locations, respectively, in a memory cell array 3. Like the sample memory cells 10a, 10b, the sample memory cells 27a, 27b are composed of an EPROM cell. Firstly, a reference voltage is set by sequentially selecting the sample memory cells 10a, 10b. The obtained reference voltage $V_{REF1}$ (a first reference voltage) is stored in storage means, e.g., a register 28 connected to a CPU 1. Next, a reference voltage is set by sequentially selecting the sample memory cells 27a, 27b. The obtained reference voltage $V_{REF2}$ (a second reference voltage) is stored in the register 28. Then, the CPU 1 sets an intermediate voltage of the reference voltages $V_{REF1}$, $V_{REF2}$, as a reference voltage $V_{REF}$.

Figure 4:
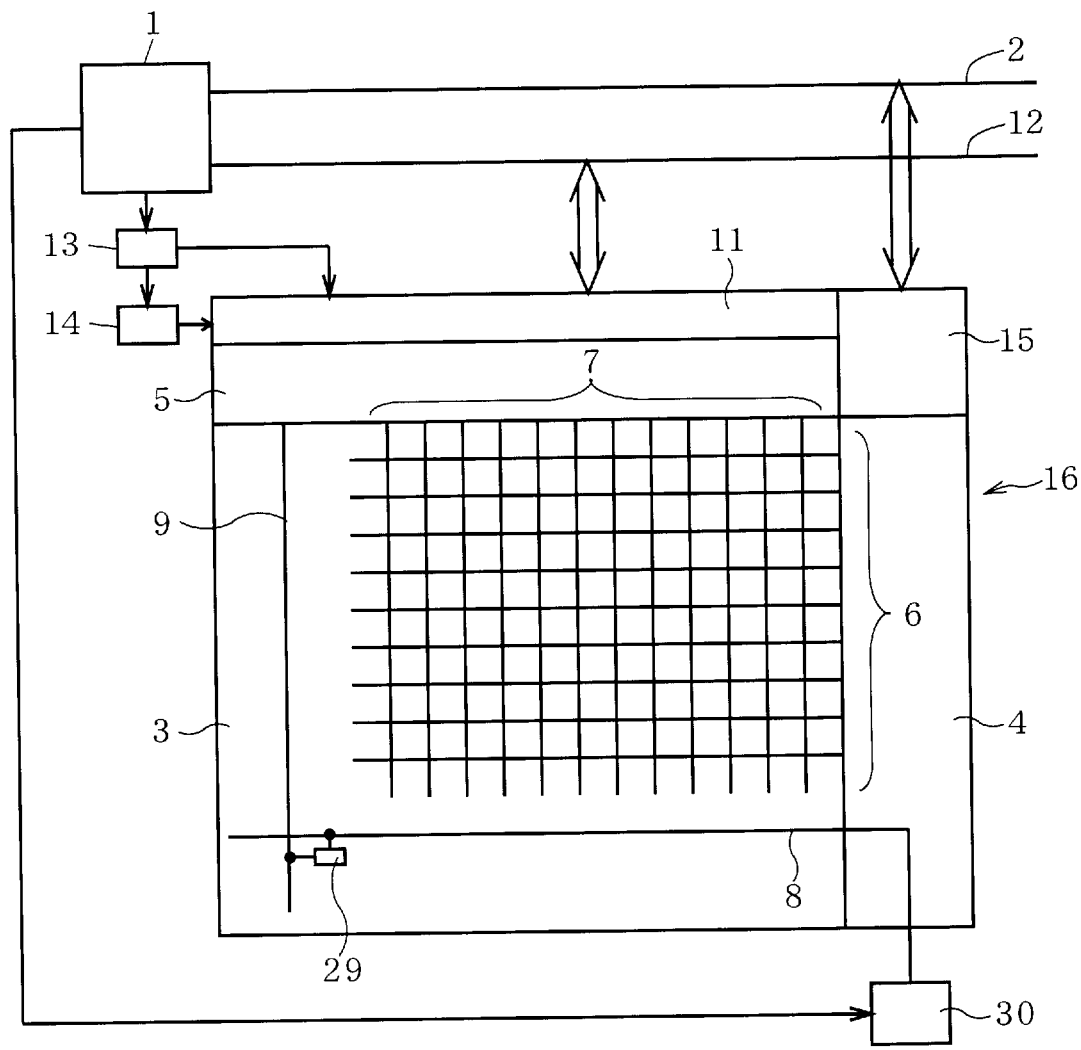
FIG. 4 is a schematic diagram showing still another example of a memory configuration.
Figure 5:
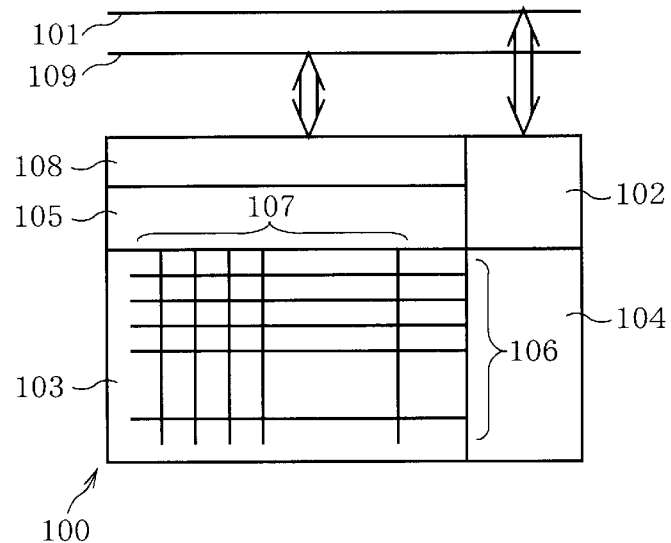
FIG. 5 is a schematic diagram showing a general memory configuration.
Figure 6:
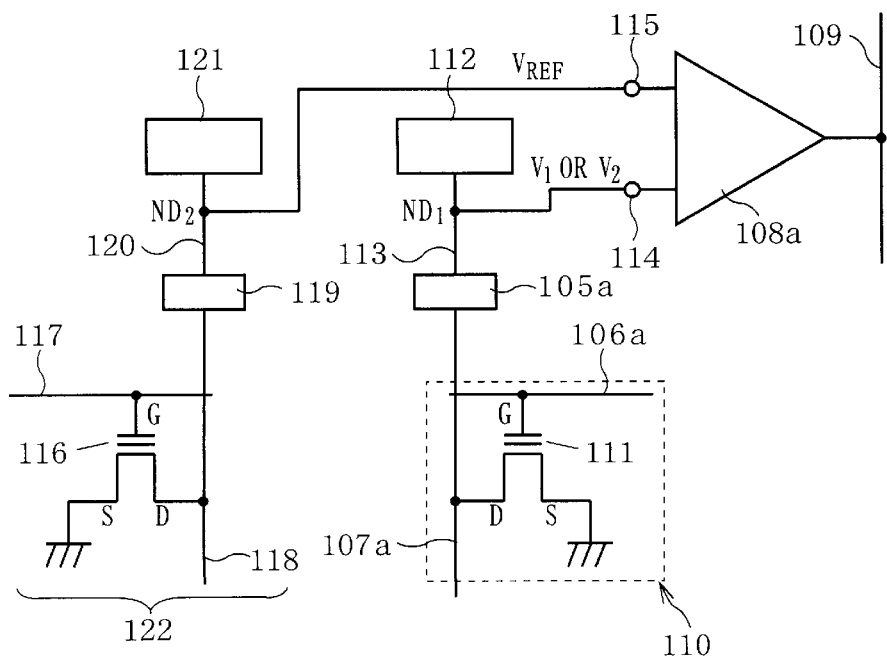
FIG. 6 is a block diagram showing the configuration of a conventional data read circuit.

Also, although the foregoing description demonstrates the cases where the sample memory cell 10a for storing data "1" and the sample memory cell 10b for storing data of "0" are provided separately, it is possible to set a reference voltage by providing a single sample memory cell. FIG. 4 is a schematic diagram showing still another configuration of a memory 16. Like the sample memory cells 10a, 10b, a sample memory cell 29 is composed of an EPROM cell. After the power supply of a device is turned on, firstly a similar operation as stated is performed in the state where data "1" is written in the sample memory cell 29, to detect a voltage $V_{22}$. Based on a control signal from a CPU 1, a data write circuit 30 applies a high voltage to a word line 8, to write data "0" in the sample memory cell 29. A similar operation as stated is performed to detect a voltage $V_1I$. Then, a reference voltage $V_{REF}$ is set based on the voltages $V_{11}$ and $V_{22}$.

The foregoing description is assumed to the cases where the data memory cells constituting the memory cell array 3 are composed of an EPROM cell. To match element characteristics, therefore, the sample memory cells 10a, 10b, 27a, 27b and 29, are also composed of an EPROM cell. The present invention is, however, applicable to the cases where the data memory cells constituting the memory cell array 3 are composed of a memory element different from the EPROM cell, by employing sample memory cells 10a, 10b, 27a, 27b and 29 which are all composed of the same memory element as the data memory cell.

Although the above description demonstrates the cases where a reference voltage $V_{REF}$ is set after the power supply is turned on, a reference $V_{REF}$ may be set when the mode using an exterior memory different from the memory 16 is changed to that using the memory 16.

Thus, the data read circuit of the present invention does not call for a memory transistor 116 as required in conventional data read circuit. This avoid such a complicated work in which a memory transistor 116 having a proper characteristics is selected according to the characteristics of a memory transistor 111 and the like, thereby shortening the term of works.

Since a single sense amplification has both functions of reading the data stored in a data memory cell and of setting a reference voltage $V_{REF}$, the above effect is attained without making the circuit complicated.

Also, a reference voltage $V_{REF}$ can be reset by a simple work in which voltages $V_{11}$, $V_{22}$ are redetected for correcting these values stored in the control circuit 13. This facilitates to cope with the aged deterioration of element characteristics and the like.

When a sample memory cell is arranged in a memory cell array 3, the fluctuation in the characteristics of a sample memory cell becomes similar to that in a data memory cell, providing a proper setting of a reference voltage $V_{REF}$.

When sample memory cells are arranged in a plurality of locations in a memory cell array 3, it is possible to react to the fluctuations of characteristics in a plurality of locations in the memory cell array 3, leading to an improved setting of a reference voltage $V_{REFF}$ With a single sample memory cell, the number of sample memory cells to be prepared can be reduced compared to the cases of providing a pair of sample memory cells 10a, 10b.

While the invention has been shown and described in detail, the foregoing description is in all aspects illustrative and not restrictive. It is therefore understood that numerous modifications and variations can be devised without departing from the scope of the invention.

We claim:

1. A data read circuit that compares a reference voltage with a first voltage whose value fluctuates depending on as to whether a binary data stored in a data memory cell is one data or other data and based on a comparison result, reads said data stored in said data memory cell, said data read circuit comprising:

at least one of a plurality of sample memory cells that stores said one and other data, respectively;

comparison means that compares a first comparison voltage with a second voltage corresponding to said one data stored in said at least one of said sample memory cells, and compares a second comparison voltage with a third voltage corresponding to said other data stored in said at least one of said sample memory cells; and voltage generating means that generates said first and second comparison voltages, respectively, characterized in that:

said reference voltage is set based on a comparison result obtained by said comparison means.

2. The data read circuit of claim 1 wherein a comparison between said first voltage and said reference voltage is made by said comparison means.

3. The data read circuit of claim 1 wherein said at least one of said sample memory cells is arranged in a memory cell array having a plurality of said data memory cells arranged in the form of a matrix.

4. The data read circuit of claim 3 further comprising:

a control section for controlling an operation of said data read circuit; and storage means connected to said control section, characterized in that:

said at least one of said sample memory cells is arranged in at least two locations in said memory cell array;

said storage means stores a first reference voltage obtained from said at least one of said sample memory cells arranged in a first location, and stores a second reference voltage obtained from said at least one of said sample memory cells arranged in a second location; and said control section sets said reference voltage based on said first and second reference voltages stored in said storage means.

5. The data read circuit of claim 3 further comprising data write means that sequentially writes said one and other data in said sample memory cell.

* * * * *